(12) United States Patent
Ferrell et al.

(10) Patent No.: US 11,346,905 B2
(45) Date of Patent: May 31, 2022

(54) USE OF FORWARD SENSING PROBE FOR PRETUNING OF PROBE

(71) Applicant: RAYTHEON COMPANY, Waltham, MA (US)

(72) Inventors: Jack Patrick Ferrell, Arlington, VA (US); Firat Kara, Manassas, VA (US); David G. Penn, Centreville, VA (US)

(73) Assignee: RAYTHEON COMPANY, Waltham, MA (US)

( * ) Notice: Subject to any disclaimer, the term of this patent is extended or adjusted under 35 U.S.C. 154(b) by 205 days.

(21) Appl. No.: 16/705,984

(22) Filed: Dec. 6, 2019

(65) Prior Publication Data

US 2021/0173022 A1 Jun. 10, 2021

(51) Int. Cl.
*G01R 33/36* (2006.01)
*G01R 33/58* (2006.01)
*G01R 33/44* (2006.01)

(52) U.S. Cl.
CPC ....... *G01R 33/3628* (2013.01); *G01R 33/441* (2013.01); *G01R 33/583* (2013.01)

(58) Field of Classification Search
CPC .............. G01R 33/3628; G01R 33/583; G01R 33/441; G01R 33/307
USPC .......................................................... 324/307
See application file for complete search history.

(56) References Cited

U.S. PATENT DOCUMENTS

| | | | | |
|---|---|---|---|---|
| 5,594,338 A * | 1/1997 | Magnuson | ......... | G01R 33/3628 324/318 |
| 6,104,190 A * | 8/2000 | Buess | ........... | G01V 3/14 324/300 |
| 6,166,541 A * | 12/2000 | Smith | ........... | G01R 33/3607 324/300 |
| 6,411,208 B1 * | 6/2002 | Buess | ........... | G01H 13/00 324/300 |
| 6,564,158 B1 * | 5/2003 | Rabel | ........... | G01R 29/0892 702/104 |
| 7,218,105 B2 * | 5/2007 | Chisholm | ....... | G01R 33/441 324/307 |
| 7,265,550 B2 * | 9/2007 | Laubacher | ....... | G01R 33/3415 324/318 |
| 7,750,631 B2 * | 7/2010 | Crowley | ........ | G01V 3/104 324/307 |
| 9,024,636 B2 * | 5/2015 | Kozlov | ......... | G01R 33/3628 324/322 |
| 9,170,212 B2 * | 10/2015 | Bouchard | ....... | G01F 23/288 |
| 9,194,975 B2 * | 11/2015 | Drouin | .......... | G06K 9/00771 |
| 9,201,127 B2 * | 12/2015 | Kumar | ........... | G01R 33/3628 |
| 10,823,775 B2 * | 11/2020 | Anderson | ....... | G01R 29/0878 |
| 10,859,620 B2 * | 12/2020 | Bickford | ........ | G01R 29/0878 |
| 2005/0104603 A1 * | 5/2005 | Peschmann | ....... | G01R 27/06 324/637 |

(Continued)

*Primary Examiner* — Christopher P McAndrew
(74) *Attorney, Agent, or Firm* — Lando & Anastasi, LLP

(57) ABSTRACT

Systems and methods for pre-tuning a main Nuclear Quadrupole Resonance (NQR) probe using a forward sensing probe include a determination of an amount of resonance detuning of the forward sensing probe caused by a moving object entering a field of view of the forward sensing probe. The amount of resonance detuning is used to pre-tune the main probe such that when the moving object enters a field of view of the main probe, the main probe will move back into tune while delivering optimal power to the object for measurement and identification of a material therein.

21 Claims, 9 Drawing Sheets

(56) References Cited

U.S. PATENT DOCUMENTS

| | | | | |
|---|---|---|---|---|
| 2005/0110672 A1* | 5/2005 | Cardiasmenos | ... | G01N 21/3581 |
| | | | | 342/27 |
| 2006/0066469 A1* | 3/2006 | Foote | ...... | G01S 13/89 |
| | | | | 342/22 |
| 2006/0139032 A1* | 6/2006 | Kalokitis | ......... | G01R 29/0814 |
| | | | | 324/457 |
| 2007/0176600 A1* | 8/2007 | Laubacher | ......... | G01R 33/441 |
| | | | | 324/300 |
| 2009/0289629 A1* | 11/2009 | Tuchman | ............. | G01R 33/24 |
| | | | | 324/304 |
| 2010/0277312 A1* | 11/2010 | Edic | ...... | G01V 5/005 |
| | | | | 340/540 |
| 2011/0102597 A1* | 5/2011 | Daly | ............ | G01S 13/887 |
| | | | | 348/162 |
| 2014/0070810 A1* | 3/2014 | Robert | .............. | G01R 33/36 |
| | | | | 324/322 |
| 2014/0113828 A1* | 4/2014 | Gilbert | ..................... | H01F 6/06 |
| | | | | 505/100 |
| 2017/0099200 A1* | 4/2017 | Ellenbogen | ............ | G06N 20/00 |

\* cited by examiner

USE OF FORWARD SENSING PROBE FOR PRETUNING OF PROBE

BACKGROUND

Nuclear Quadrupole Resonance spectroscopy (NQR) is a non-intrusive inspection technology that has broad applications to defense and security markets. NQR is a radiofrequency (RF) technique related to Nuclear Magnetic Resonance (NMR). NQR differs from NMR by detecting NQR transitions of nuclei without requiring a static magnetic field to be present.

When a nucleus has more than one unpaired nucleon, the nucleus will have a nuclear charge distribution that results in an electric quadrupole moment. The quadrupole moment interacts with an electric field gradient (EFG). The product of the quadrupole moment and the EFG located in the neighborhood of the nucleus is proportional to an NQR frequency of a particular material. By detecting the resonant NQR frequency of a material with a tuned antenna, the material can be readily identified.

One possible problem with existing NQR systems is that a system needs to be tuned each time it performs a measurement and for each different material being inspected in a measurement. That can be a limitation in applications that require fast response times, such as making measurements on a moving target, such as a vehicle. Current methods of autotuning are not fast enough to tune the system and have enough time for measurement while a moving target is in the field of view, so a different solution is needed.

SUMMARY OF INVENTION

Aspects and embodiments are directed to a forward resonance probe technology that separates the tuning process of the resonance probe from the measurement process, thus improving detection probabilities and lowering false alarm rates by allowing all of the measurement time that the object is within the field of view of the measurement probe to be used for resonance measurement.

Certain examples use a forward sensing probe (FSP) that is located upstream from at least one main NQR probe (MP) to measure the impact of a target on the system tuning, and to adjust the tuning of the main probe before the target enters the field of view of the main probe.

In certain examples, the system also includes more than one FSP and/or more than one MP, such that respective pairs of an FSP and an MP are designed to detect a specific NQR frequency range, thereby allowing the system to detect multiple different materials in one or more objects.

Aspects and embodiments are directed to a method of nuclear quadrupole resonance (NQR) measurement of an object, comprising: detecting an object as it enters a field of view of a forward sensing resonance probe (FSP), determining an amount of resonance detuning of the FSP caused by the detected object, and pre-tuning a main resonance probe (MP) based on the amount of detuning of the FSP.

In one embodiment, the pre-tuning occurs before the object enters a field of view of the MP.

In another embodiment, detecting the object with the FSP includes detecting the object entering the field of view of the FSP with the at least one proximity sensor. In response to detecting the object, asynchronously triggering a resonance measurement of the object with the FSP to determine the amount of resonance detuning of the FSP. The resonance measurement comprises measuring an impedance including a reactance of the object and the pre-tuning of the MP is based on the measured impedance.

In one embodiment, the pre-tuning of the MP comprises tuning the MP to an opposite reactance of a measured reactance of the FSP.

In another embodiment, the FSP also determines a speed of the object and the MP is pre-tuned based on both of the calculated speed of the object and the determined impedance of the detected object.

In one embodiment, the method includes performing a first determination of whether an object is detected within the field of view of the (FSP), and when the object is detected within the field of view of the FSP, triggering a measurement of the object. The method also includes performing a second determination of whether the object is detected within a field of view of the MP, and when the object is detected within the field of view of the MP, measuring the object with the MP.

In another embodiment, the method includes repeating the first determination until the object is detected within the field of view of the MP.

In one embodiment, the MP is pre-tuned in less than 1 second.

In a preferred embodiment, the MP is pre-tuned in less than 0.1 seconds.

In one embodiment, the object is any one of a vehicle, baggage or cargo.

In another embodiment, at least one of the FSP and the MP operates in a range of 100 kHz to 10 MHz. In one example, the FSP and MP operate at the same frequency or frequency range.

In one embodiment, the object comprises a material that is identified by the MP when the object is measured by the MP within the field of view of the MP.

In another embodiment, detecting the object comprises: waiting for the object to enter a field of view of the FSP, and detecting that the object is within the field of view of the FSP when a first proximity sensor indicates a presence of the object entering the field of view of the FSP.

In one embodiment, the structure of each FSP and/or each MP is a loop tuned to a desired frequency. Aspects and embodiments are directed to a nuclear quadrupole resonance (NQR) measuring system, comprising: a forward sensing resonance probe (FSP), a main NQR probe (MP), and a tuner coupled to each of the forward sensing resonance probe and the main NQR probe, wherein the FSP is configured to detect an object as it enters a field of view of the FSP and to measure the object and determine an amount of resonance detuning of the FSP caused by the detected object, and wherein the tuner is configured to pre-tune the MP based on the determined amount of resonance detuning of the FSP.

In one embodiment, the FSP includes at least one proximity sensor and detecting the object with the FSP includes detecting the object entering the field of view of the FSP with the at least one proximity sensor. In response to detecting the object with the at least one proximity sensor, the FSP asynchronously triggers a resonance measurement of the object to determine the amount of resonance detuning of the FSP. The resonance measurement comprises determining an impedance including a reactance of the object. The pre-tuning of the MP is based on the determined impedance.

In another embodiment, the pre-tuning of the MP comprises tuning the MP to an opposite reactance of a measured reactance of the FSP.

In one embodiment, the FSP is also configured to determine a speed of the object. The tuner is configured to pre-tune the MP based on both of the determined speed and the determined impedance of the object.

In another embodiment, the system includes a plurality of FSPs and a plurality of MPs, and each FSP of the plurality of FSPs having a corresponding MP of the plurality of MPs. Each FSP of the plurality of FSPs and each MP of the plurality of MPs has a respective matching network.

In one embodiment, the system includes a plurality of FSPs and a plurality of MPs, the plurality of FSPs including the FSP, the plurality of MPs including the MP, and each FSP of the plurality of FSPs having a corresponding MP of the plurality of MPs. In one embodiment, all of the FSPs are stacked on top of each other.

In another embodiment, the system includes a plurality of MPs, wherein the plurality of MPs is arranged in a series, and each MP is tuned to a different frequency.

In one embodiment, the tuner is configured to pre-tune the MP in less than 1 second.

In a preferred embodiment, the tuner is configured to pre-tune the MP in less than 0.1 seconds.

In one embodiment, the system is configured to detect the object that is any one of a vehicle, baggage or cargo.

In another embodiment, at least one of the FSP and the MP operates in a range of 100 kHz to 10 MHz. In one example, the FSP and MP operate at the same frequency or frequency range.

In one embodiment, the object comprises a material and the material is identified by the MP when the object is measured by the MP within the field of view of the MP.

In another embodiment, multiple materials are detected by the system according to:

$$d_s = v_m t_T + (n-1) d_m,$$

where:
$d_s$ is an overall length of the system,
$v_m$ is a maximum velocity of the object,
$t_T$ is a maximum tune time,
n is a number of materials to be measured by the system, and
$d_m$ is the distance separating adjacent MPs of the plurality of MPs.

In one embodiment, multiple materials are detected by the system according to:

$$d_{fm} = v_m t_T = n(d_{fm} + w) + d_c,$$

where:
$d_{fm}$ is the distance between matched probes,
w is the width of an antenna, and
$d_c$ is the distance between an innermost matched probe pair.

In another embodiment, multiple materials are detected by the system according to:

$$v_m t_T = (d_d + w) = dfm1,$$

where:
$v_m$ is a maximum velocity of the object,
$t_T$ is a maximum tune time,
$d_d$ is a distance between each FSP in an overlapping stack of the plurality of FSPs and a first MP of the plurality of MPs,
w is a width of an antenna, and
$d_{fm1}$ is the distance between each FSP of the stacked FSPs and the first MP of the plurality of MPs.

In one embodiment, the system includes a second MP of the plurality of MPs, and the distance between the stack of FSPs and the second MP is $d_{fm2}$, and $d_{fm2} > d_{fm1}$. In another embodiment, the system includes a third MP of the plurality of MPs, and the distance between the stack of FSPs and the third MP is $d_{fm3}$, and $d_{fm3} > d_{fm2} > d_{fm1}$.

In another embodiment, the field of view of the FSP includes a first pair of proximity sensors the field of view of the FSP is defined by the first pair of proximity sensors, wherein the amount of detuning is determined by the FSP while the object is within the field of view of the FSP. The field of view of the MP is defined by a second pair of proximity sensors, wherein a first sensor of the second pair of proximity sensors activates when the object is detected and is no longer detected in the field of view of the FSP, and wherein the object is measured by the MP while the object is in the field of view of the MP.

In one embodiment, the structure of each FSP and/or each MP is a loop.

Aspects and embodiments are directed to a method of nuclear quadrupole resonance (NQR) measurement of an object, comprising: performing a first determination of whether an object is detected within a field of view of a forward sensing resonance probe (FSP), when the object is detected within the field of view of the FSP, triggering a measurement of the object with the FSP, wherein the measurement comprises determining an amount of resonance detuning of the FSP caused by the detected object, pre-tuning a main NQR probe (MP) based on the amount of detuning of the FSP, performing a second determination of whether the object is detected within a field of view of the MP, and when the object is detected within the field of view of the MP, measuring the NQR signal of the object with the MP.

In one embodiment, the pre-tuning occurs before the object enters a field of view of the MP.

In another embodiment, the FSP comprises at least one proximity sensor and detecting the object with the FSP includes detecting the object entering the field of view of the FSP with the at least one proximity sensor. In response to detecting the object with the at least one proximity sensor, the FSP asynchronously triggers a resonance measurement of the object with the FSP to determine the amount of resonance detuning of the FSP. The resonance measurement comprises determining an impedance including a reactance of the object and the pre-tuning of the MP is based on the determined impedance.

In one embodiment, the pre-tuning of the MP comprises tuning the MP to an opposite reactance of a measured reactance of the FSP.

In another embodiment, the FSP also determines a speed of the object and the MP is pre-tuned based on both of the determined speed and the determined impedance.

In another embodiment, the MP is pre-tuned in less than 1 second.

In one embodiment, the MP is pre-tuned in less than 0.1 seconds.

In another embodiment, the object is any one of a vehicle, baggage or cargo.

In one embodiment, at least one of the FSP and the MP operates in a range of 100 kHz to 10 MHz. In one example, the FSP and MP operate at the same frequency.

In another embodiment, the object comprises a material and the material is identified by the MP when the object is measured by the MP within the field of view of the MP.

In one embodiment, detecting the object comprises: waiting for the object to enter the field of view of the FSP, and detecting that the object is within the field of view of the FSP when a first proximity sensor indicates a presence of the object entering the field of view of the FSP.

In another embodiment, the pre-tuning occurs before the object enters a field of view of the MP.

In one embodiment, the method includes performing a first determination of whether an object is detected within the field of view of the (FSP), and when the object is detected within the field of view of the FSP, triggering a measurement of the object. The method also includes performing a second determination of whether the object is detected within a field of view of the MP, and when the object is detected within the field of view of the MP, measuring the object with the MP. In another embodiment, method includes repeating the first determination until the object is detected within the field of view of the MP.

In one embodiment, detecting the object comprises: waiting for the object to enter the field of view of the FSP, and detecting that the object is within the field of view of the FSP when a first proximity sensor indicates a presence of the object entering the field of view of the FSP.

In another embodiment, the structure of each FSP and/or each MP is a loop.

Still other aspects, embodiments, and advantages of these exemplary aspects and embodiments are discussed in detail below. Embodiments disclosed herein are combined with other embodiments in any manner consistent with at least one of the principles disclosed herein, and references to "an embodiment," "some embodiments," "an alternate embodiment," "various embodiments," "one embodiment" or the like are not necessarily mutually exclusive and are intended to indicate that a particular feature, structure, or characteristic described is included in at least one embodiment. The appearances of such terms herein are not necessarily all referring to the same embodiment.

BRIEF DESCRIPTION OF DRAWINGS

Various aspects of at least one embodiment are discussed below with reference to the accompanying figures, which are not intended to be drawn to scale. The figures are included to provide illustration and a further understanding of the various aspects and embodiments, and are incorporated in and constitute a part of this specification, but are not intended as a definition of the limits of the invention. In the figures, each identical or nearly identical component that is illustrated in various figures is represented by a like numeral. For purposes of clarity, not every component is labeled in every figure. In the figures.

DETAILED DESCRIPTION

Aspects and embodiments are directed to systems for nuclear quadrupole resonance (NQR) measurement of an object, and methods of using the same.

Conventional systems and methods of identifying materials using NQR require determining an amount of detuning caused by the object while it is within the field of view of a probe. This wastes valuable time to identify a material of the object while it is still within the field of view. Aspects and embodiments are directed to a forward probe technology described herein that separates the tuning process from measuring process, thus improving detection probabilities and lowering false alarm rates by providing for substantially all of the time that the object is within the field of view of the main probe to be used for detection and measurement of the object. Accordingly, various aspects and embodiments provide more time for a main probe to measure threat materials in an object than if the main probe was also doing tuning, because the object is within the probe's field of view for a longer period of time and the probe's antenna is pre-tuned for optimal power transmission.

Objects that are metallic cause NQR probes to detune through inductive/capacitive coupling. The effect of the detuning due to coupling is two-fold. Firstly, it reduces the transmitted probe's power output, thereby reducing system performance. Secondly, the probe will not adequately absorb the target signal, further reducing system performance.

To be able to perform a measurement of a moving target with a main probe, aspects and embodiments uses apriori data of the effect the target has on the tuning of a forward sensing probe (FSP) to adjust (pretune) the tuning of the main probe so that as the target moves into a field of view of the main probe (MP), the main probe is pre-tuned to account for the detuning of the main probe by the object. One example of a resonance measurement that is accomplished with the FSP is passive resonance measurement. It is also appreciated that other resonance measurements can be done by the FSP, such as NQR measurements. Certain examples use at least one FSP that is located upstream from at least one MP to measure the impact of a target on the system tuning, and to adjust the tuning of the NQR main probe (MP) before the target enters the field of view of the MP. In certain examples, the system also includes more than one FSP and/or more than one MP, such that respective pairs of an FSP and an MP are designed to detect a specific NQR frequency range, thereby allowing the system to detect multiple different materials in an object.

Figure 1:
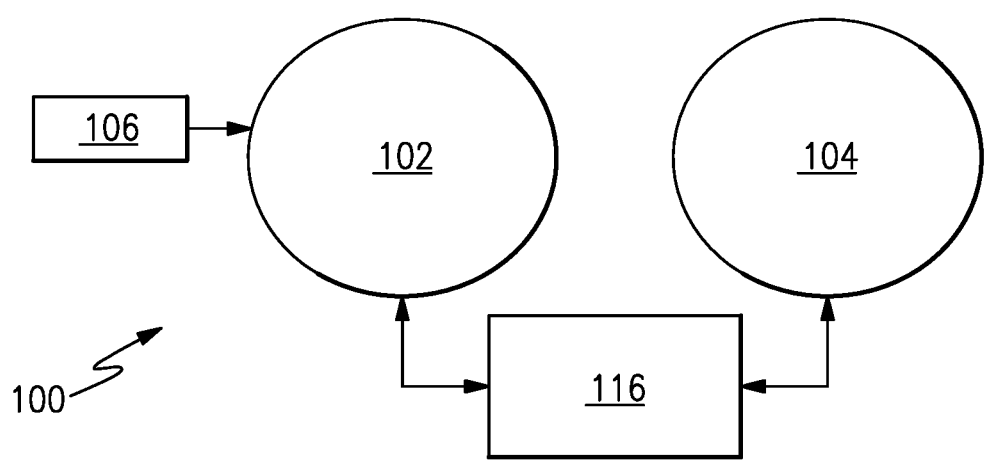
FIG. 1 is a general block diagram of a nuclear quadrupole (NQR) system for measurement of an object.

FIG. 1 is general block diagram of an NQR measurement system 100 for measurement of an object. The system includes a forward sensing probe 102, a main probe 104, a proximity sensor 106 and a tuner 116. In one example, the forward sensing probe (FSP) 102 and the proximity sensor 106 are operated such that, until the proximity sensor 106 detects a moving object about to enter a field of view of the forward sensing probe (FSP) 102, the FSP 102 remains idle. Upon detection of the object by the sensor 106, the FSP 102 is triggered to measure the object passing through the FOV of the FSP 102. In one example, the measurement of the object by the FSP is a resonance measurement of the amount that the FSP is detuned by the object.

In one example, the FSP 102 is a resonance probe that passively measures an amount of resonant de-tuning that the object has on the FSP. In another example, the FSP 102 is substantially identical to the main probe 104. With such arrangements, the amount of detuning of the FSP 102 caused by a moving object is determined and provided to the main probe (MP) 104 so that the MP is pre-tuned by the amount of de-tuning of the FSP by the object to provide for an optimally pre-tuned MP for when the moving object enters a field of view of the MP 104 and detunes the MP 104.

In an example, the structure of each FSP and/or each MP is a loop. The loop may be constructed of metal including one or more coils, wires, tubing, or electrical conductors. The loop may also be constructed of one or more other materials known in the art.

In one example, the tuner 116 comprises at least one matching network, at least one auto-tuner controller and a master controller.

Figure 2A:
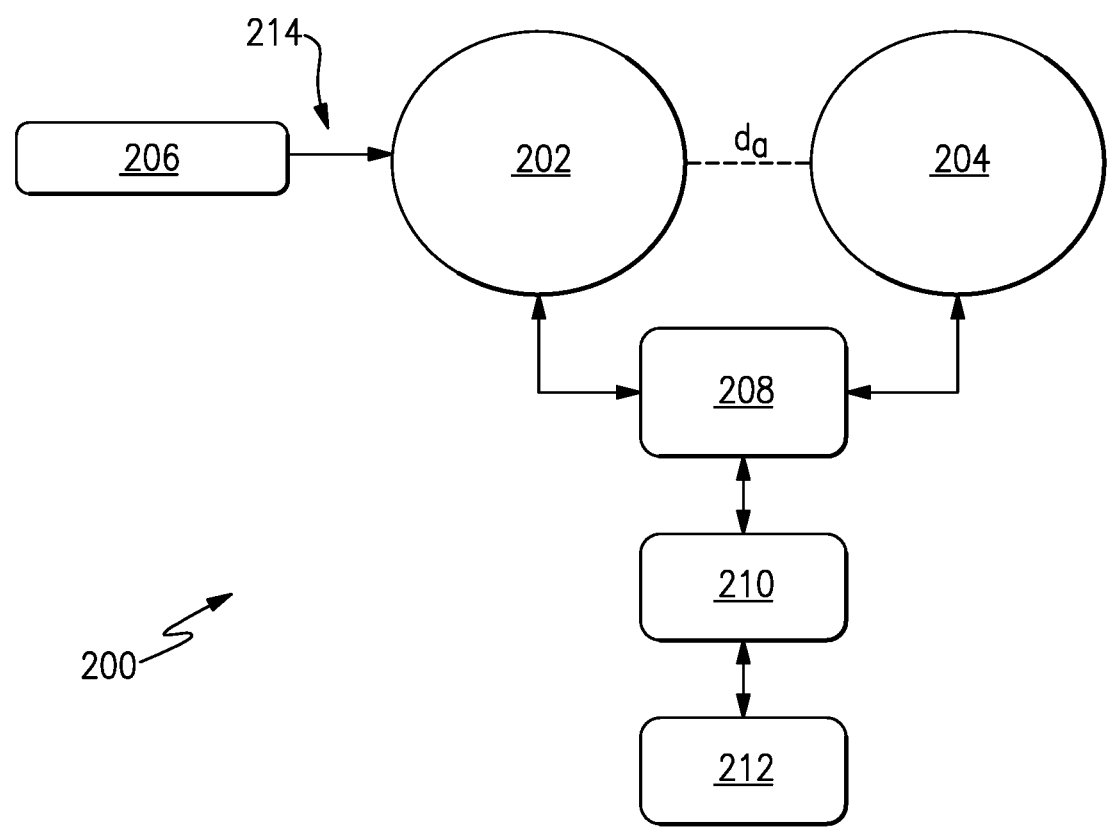
FIG. 2A is a block diagram of an example NQR system, where a forward sensing probe is separated from a main probe by a distance.
Figure 2B:
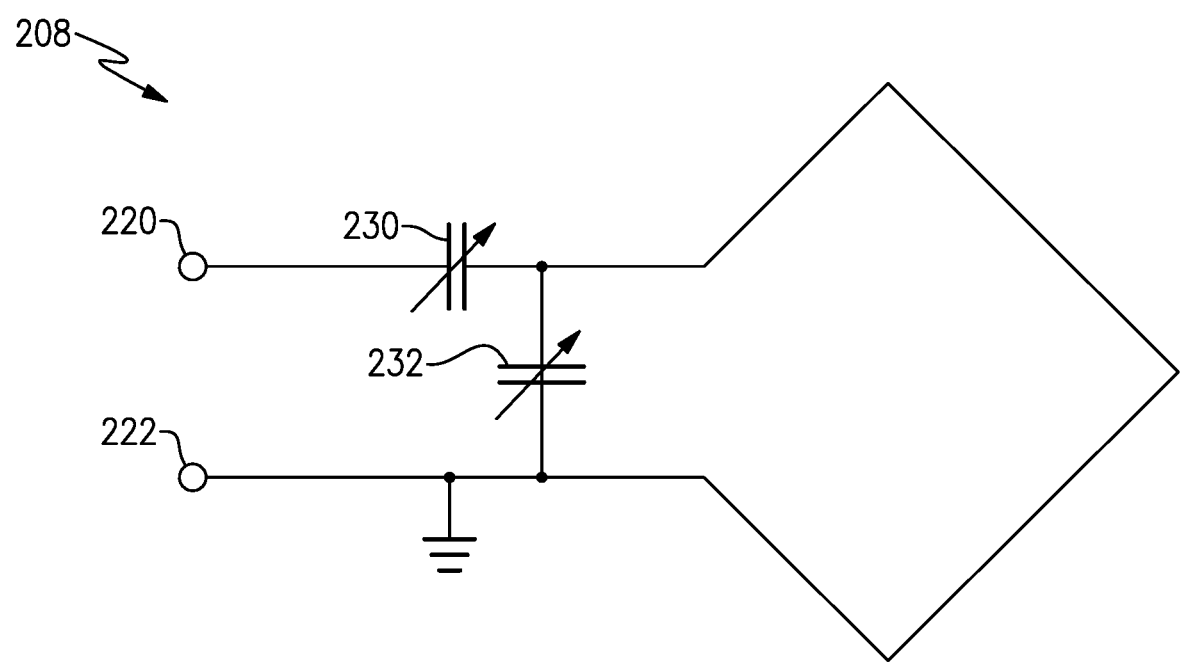
FIG. 2B is an example of the matching network that can be used with any of the example NQR measurement systems disclosed herein.

Referring to FIG. 2B and as will be explained in further detail below, the matching network is comprised of components typical in the art, such as capacitors and inductors. The role of the matching network is to adjust the impedance of the attached probe by changing the series and shunt capacitances in the tank circuit of the probe to tune the probe to the desired resonant frequency.

Proximity sensor 106 is any sensor known to those in the art that detects the presence of an object. Such a sensor is, for example, ultrasonic, infra-red (IR), inductive, capacitive, photo-electric, diffuse or magnetic.

In one example of a proximity sensor, a camera is used to detect an object within one or more images. The detection utilizes image analysis techniques to detect and/or recognize the object. Object distance relative to the camera is determined, for example, utilizing stereoscopic techniques, change in apparent object size across multiple frames over time, or a comparison of a known object size based on a predetermined distance to the camera and/or size within an image.

In another example of a proximity sensor, a range meter, such as a laser distance meter, is used to determine the presence of an object and/or its distance to a probe. In response to detecting the moving object, the proximity sensor 102 asynchronously triggers a resonance measurement of the moving object by the FSP to determine the amount of resonant detuning of the FSP. The asynchronous trigger is a timing protocol that begins a measurement and determination of a reactance change of the FSP in response to detection of the object by the proximity sensor 102. In one example, the reactance change of the FSP by the object is determined by the auto-tuner controller coupled to the FSP. The change of measured reactance (inductive or capacitive) in the FSP 102 is used to pre-tune the MP 104 to an opposite reactance of the measured reactance to anticipate (pre-tune) the impact of the object on the MP 104.

In one example, the MP is pre-tuned in less than 0.1 seconds.

In one example, the moving object is any one of a vehicle, baggage or cargo.

In another example, the FSP and MP operate at the same frequency or over a same frequency range.

In one example, at least one of FSP 102 and MP 104 operates anywhere in a range of 100 kHz to 10 MHz. However, it is understood that the frequency range and bandwidth is a function of the types of materials that are to be detected and that the FSP and MP can be tuned to different frequency ranges and bandwidths to provide for detecting various materials.

In one example, the object comprises a material that is measured by the MP when the object is within the field of view of the MP and based on the NQR measurement is identified by the master controller connected to the MP based on the measured NQR response.

FIG. 2A is a block diagram of another example NQR system 200 for measurement of an object. The system includes a forward sensing probe 202, a main probe 204, a proximity sensor 206, a matching network 208, an auto-tuner controller 210 and a master controller 212.

Not all of the elements of system 200 will be described herein. The common elements of the system of FIG. 2A and FIG. 1 will not be described for the sake of brevity.

FSP 202 and MP 204 are separated by a distance $d_a$.

Until the proximity sensor 206 detects a moving object about to enter a field of view of the FSP 202, the FSP 202 remains idle. When the proximity sensor 206 detects the moving object, the asynchronous trigger 214 triggers the FSP to perform a resonance measurement of the object with FSP 202. The resonance measurement determines an amount of tuning change of the FSP by the moving object. In one embodiment, the resonance measurement is of the impedance including a reactance of the moving object.

In the example of FIG. 2A, FSP 202 is separated from MP 204 by distance $d_a$, and the FSP 202 is located upstream from the MP 204. The distance $d_a$, in addition to any distance between the proximity sensor 206 and FSP 202, provides an overall distance between the MP and FSP 202 that allows for enough time while the object is within a field of view of FSP 202 to determine the object's detuning of the FSP 202 and the objects eventual impact on MP 204, and to provide the tuning information to the MP 204 and pre-tune the MP 204 for the object for when the object moves into a field of view of MP 204.

The FSP 202 is connected to matching network 208 through a wired connection. The MP 204 is connected to the matching network 208 through a wired connection. Auto-tuner controller 210 is configured to control the matching network 208 such that matching network 208 adjusts the tuning of the MP 204 to an opposite reactance of that measured by the FSP 202.

FIG. 2B is an example of the matching network 208. In the illustrated example, the matching network 208 includes a first input 220, a second input 222, a series variable capacitor 230, and a shunt variable capacitor 232. In other example matching networks, one or more of the first variable capacitor 230 and second variable capacitor 232 may be replaced with a resistor or inductor in any combination known to those in the art to create a matching network. Matching network 208, as illustrated in FIG. 2B and described above, may be used as a matching network for any matching network and with any measurement system as described herein.

Master controller 212 is configured at least to control auto-tuner controller 210. Master controller is configured to control the auto-tuner controller 210 to control what frequency to tune the MP based on the measurement by the FSP. One of the auto-tuner controller 210 and the Master controller 212 is also configured to control detection by the proximity sensor 206.

In one example of system 200, proximity sensor 206 includes a pair of proximity sensors. The pair of proximity sensors define the field of view of FSP 202 such that the object is measured by FSP 202 from the time it is first detected by a first one of the proximity sensors of the pair of proximity sensors to a later time when it is last detected by a second proximity sensor of the pair of proximity sensors.

In another example of system 200, the system includes a third proximity sensor in addition to the pair of proximity sensors to determine when the object has entered the field of view of MP 204. The object is measured while it is within the field of view of MP 204. In another example, the system can include a fourth proximity sensor to determine when the object is leaving or has left the field of view of the MP 204 so that the MP 204 can be controlled to stop measuring the object.

Figure 3:
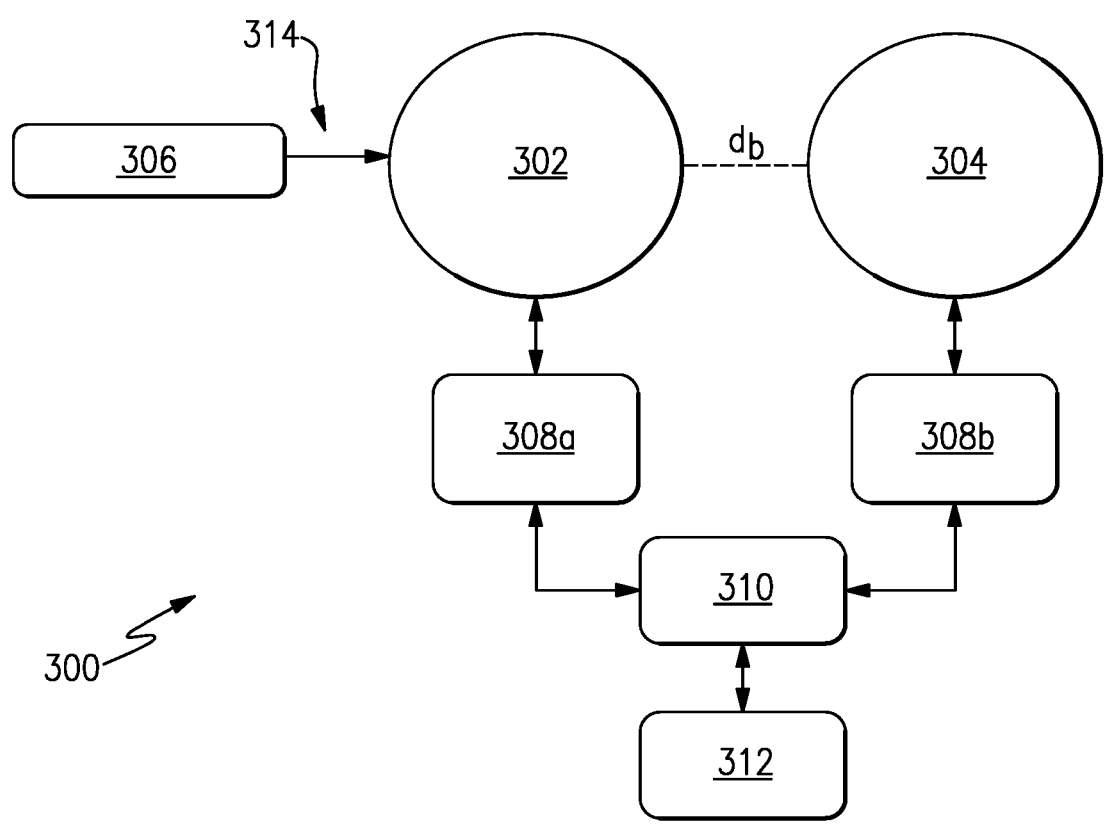
FIG. 3 is a block diagram of another example NQR system, where a forward sensing probe is separated from a main probe by a distance.

FIG. 3 is a block diagram of another example NQR system 300 for measurement of an object. The system includes at least a forward sensing probe 302, a main probe 304, a proximity sensor 306, a matching network 308a, a matching network 308b, an auto-tuner controller 310 and a master controller 312. In the NQR system of FIG. 3, the FSP 302 is separated from the MP 304 by a distance $d_b$.

Not all of the elements of system 300 will be described herein. The common elements of the system of FIG. 3 and the systems of FIG. 1 and FIG. 2A will not be described for the sake of brevity. The system of FIG. 3 is different in that FSP 302 is connected to matching network 308a and MP 304 is connected to matching network 308b. Matching network 308a and matching network 308b have the same structure, however each is tuned differently. An object moving into the field of view of FSP 302 will cause matching network 308a to change from a state of being tuned to a state of being detuned. The tuning and detuning of matching network 308a is then used to pre-tune MP 304 with matching network 308b.

In one example of system 300, distance $d_b$ may be longer than distance $d_a$. When $d_b$ is longer than $d_a$, the system 300 has more distance between the forward sensing probe 302 and the main probe 304, thereby allowing even more time than that of the system of FIG. 2A for a transfer function to be determined from FSP 302 to be used to pre-tune the MP 304. It is appreciated that the distance $d_b$, is selected such that the system 300 determines an amount of de-tuning of the FSP 302 and has sufficient time to determine how to pre-tune the MP 304.

Figure 4:
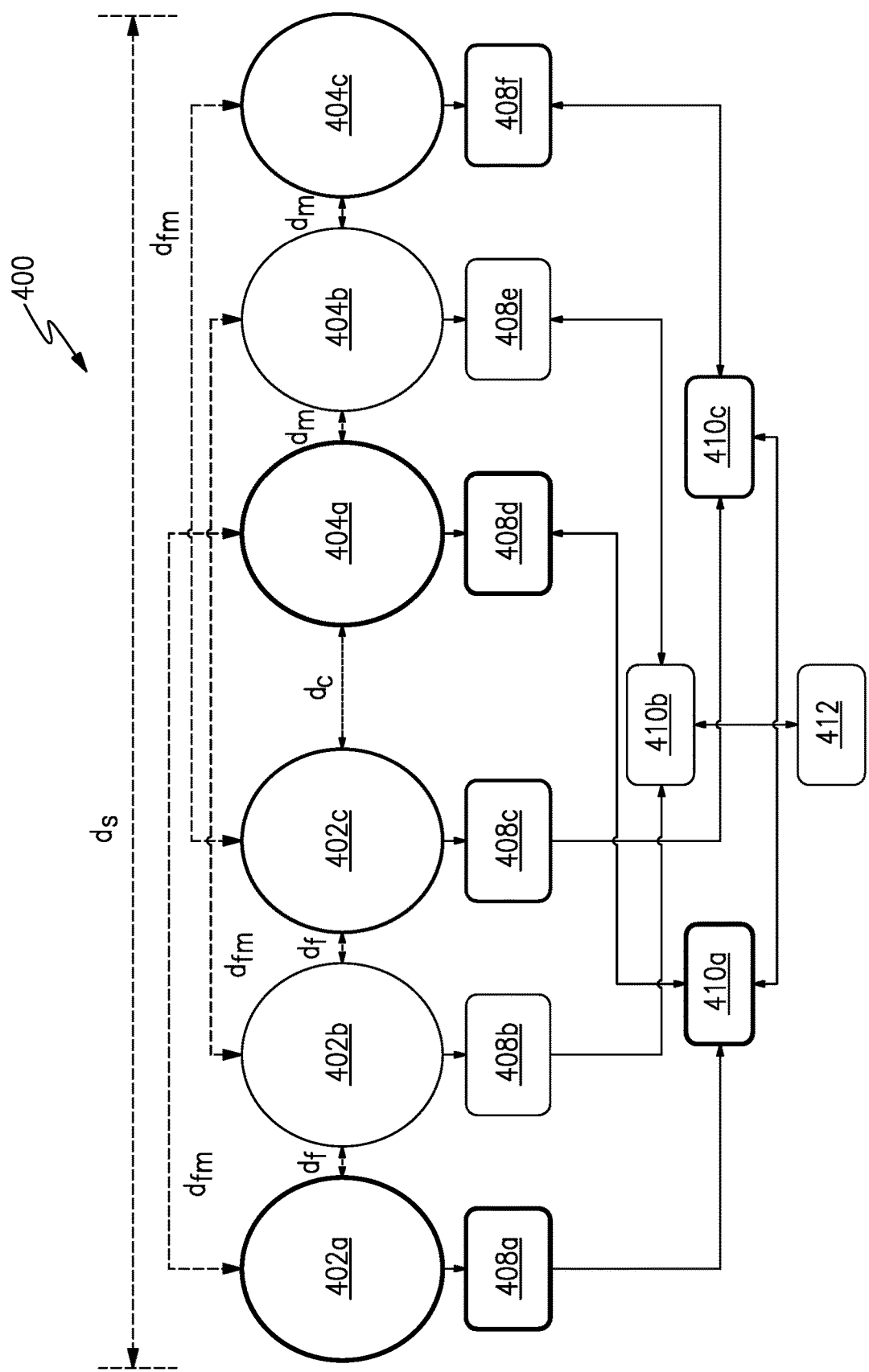
FIG. 4 is a block diagram of an example NQR system that includes multiple forward sensing probes and multiple main probes.

FIG. 4 is a block diagram of another example NQR system 400 for measurement an object. The system includes a plurality of forward sensing probes including: FSP 402a, FSP 402b and FSP 402c. The system also includes a plurality of main probes including: MP 404a, MP 404b and MP 404c. The system also includes a plurality of matching networks including matching network 408a, matching network 408b, matching network 408c, matching network 408d, matching network 408e and matching network 408f. The system also includes a master controller 412 and plurality of auto-tuner controllers including at least: auto-tuner controller 410a, auto-tuner controller 410b and auto-tuner controller 410c.

Not all of the elements of system 400 will be described herein. The common elements of the system of FIG. 4 to that of the systems of FIG. 1, FIG. 2A and FIG. 3 will not be described for the sake of brevity.

System 400 includes a plurality of forward sensing probes (402a, 402b, 402c) and a plurality of main probes (404a, 404b, 404c). Similar to system 300, each forward sensing probe is paired with a corresponding main probe. FSP 402a and MP 404a form a probe pair via matching network 410a, with the probes of the pair separated by a distance $d_{fm}$. FSP 402b and MP 404b form a pair via matching network 410b, with the probes of the pair separated by the distance $d_{fm}$. FSP 402c and MP 404c form a pair via matching network 410c, with the probes of the pair separated by the distance $d_{fm}$.

In one example of system 400, the distance $d_{fm}$ between one or more probe pairs may be the same. In another example, the distance $d_m$ between one or more probe pairs may be different than one or more other probe pairs.

One aspect and advantage of the system 400 of FIG. 4 is that FSPs 402a, 402b, and 402c and MPs 404a, 404b, and 404c are configured so that their arrangement allows for the identification of a different material with each probe pair. For example, each FSP and MP pair can be arranged to measure a certain frequency range to identify a particular material.

In reference to FIG. 4, the FSPs and MPs are arranged in any number of spatial configurations. In one example, the probes are arranged in series (i.e. from left to right in a sequence), such that a moving object would first pass FSP 402a, then FSP 402b, then FSP 402c, then MP 404a, MP 404b and finally MP 404c. This arrangement allows for an object to pass within a field of view of each respective FSP before entering a field of view of the corresponding MPs.

In another example, the FSPs and the MP are arranged in a parallel configuration such that each FSP's field of view encounters the moving object at approximately the same time, and such that MPs encounter and measure the object at approximately the same time. This arrangement allows for an object to pass within a field of view of each FSP before entering a field of view of the corresponding MPs.

Each forward sensing probe (402a, 402b, 402c) is separated from an adjacent forward sensing probe by a distance $d_f$. In one example, the distance $d_f$ is the same between each respective forward sensing probe. In another example, the distance $d_f$ is different for one or more of the forward sensing probes (402a, 402b, 402c).

Each main probe (404a, 404b, 404c) is separated from an adjacent main probe by a distance $d_m$. In one example, the distance $d_m$ is the same between each respective forward sensing probe. In another example, the distance $d_m$ is different for one or more of the main probes (404a, 404b, 404c).

In one example, $d_f = d_m$. In another example, $d_f$ and $d_m$ are different.

In one example, each pair of probes is designed and configured to detect a different material in the moving object as it passes between the field of view of one forward sensing probe to the next. For example, each FSP and corresponding MP pair can be tuned to a certain frequency range to detect a specific material. It is appreciated that operation of the FSP and MP at each frequency range is generally the same. That is, to detect a certain material, the matching network of a respective pair of probes is modified to the desired frequency range, for example, by changing a value of capacitance and/or inductance in the tuning network for a particular desired target frequency.

According to aspects and embodiments of the example system 400, multiple materials can be detected by system 400 according to:

$$d_s = v_m t_T + (n-1) d_m,$$

where:
$d_s$ is an overall length of the system,
$v_m$ is a maximum velocity of the object,
$t_T$ is a maximum tune time,
n is the number of materials to be measured by the system, and
$d_m$ is the distance separating adjacent MPs of the plurality of MPs.

The distance $d_{fm}$ may be calculated as:

$$d_{fm} = v_m t_T = n(d_{fm} + w) + d_c,$$

where:
$d_{fm}$ is the distance between matched probes (i.e. 402a and 404a), w is the width of an antenna used as the FSP and/or MP in the system 400, and $d_c$ is the distance between the innermost matched probe pair (i.e. FSP 402c and main probe 404a). The FSP and/or the MP is an antenna, which according to aspects and embodiments can be a loop antenna structure.

In an example, system 400 is configured according to the above described overall length $d_s$ and/or maximum velocity $v_m$ of the object.

In another example, system 400 includes one or more proximity sensors for determining the presence of an object within a field of view of a respective FSP and/or MP.

System 400 is shown in FIG. 4 to contain three pairs of probes by example. With this arrangement, the example system 400 shown in FIG. 4 may be used to detect three difference substances or materials on one object (i.e. one substance per matched probe pair, such as FSP 402c and MP 404a). However, it is appreciated that more or fewer probe pairs may be utilized to design the system for a different number of substances or materials. For example, if five substances or materials were to be measured for, then there would be five matched probe pairs. In other examples, one or more probe pairs may be used to scan the same substance for added reliability. For example, a reliability value may be calculated for each probe pair scanning the same substance, and the respective reliability values may be combined in a weighted average to increase the confidence in the measurement.

Figure 5:
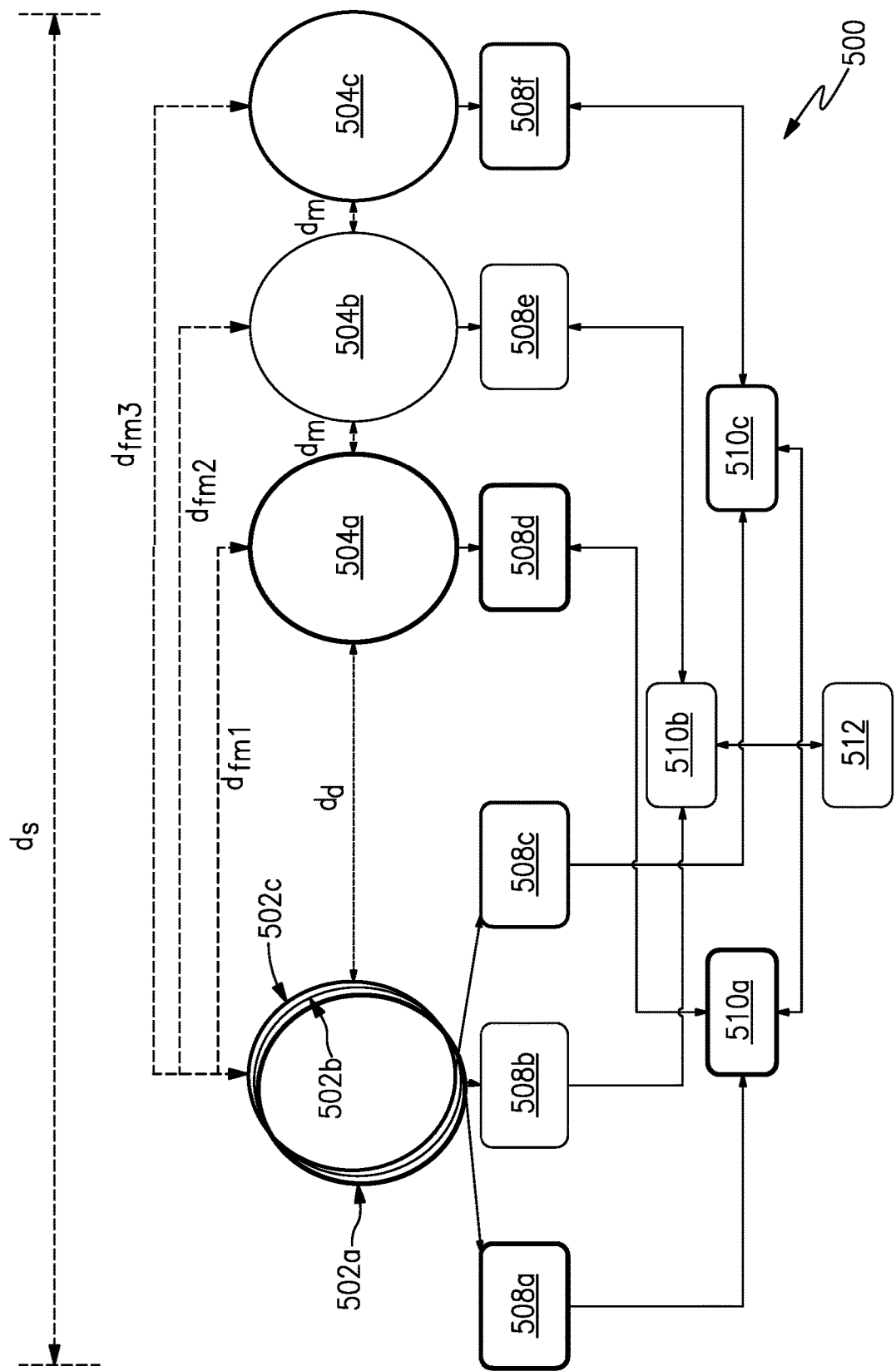
FIG. 5 is a block diagram of an example NQR system that includes multiple forward sensing probes stacked on top of each other.

FIG. 5 is a block diagram of another example NQR system 500 for measurement an object. The system includes a plurality of forward sensing probes including at least: FSP 502a, FSP 502b and FSP 502c. The system also includes a plurality of main probes including at least: MP 504a, MP 504b and MP 504c. The system also includes a plurality of matching networks including at least: matching network 508a, matching network 508b, matching network 508c, matching network 508d, matching network 508e and matching network 508f. The system also includes a master controller 512 and plurality of auto-tuner controllers including at least: auto-tuner controller 510a, auto-tuner controller 510b and auto-tuner controller 510c.

Not all of the elements of system 500 will be described herein. The common elements of the system of FIG. 5 with the systems of FIGS. 1-4 will not be described for the sake of brevity.

Like system 400, system 500 has respective pairs of FSPs (502a, 502b, 502c) and MPs (504a, 504b, 504c). However, in the case of system 500, each FSP is stacked on top of one another (in parallel) such that each FSP in the stack is located at a distance $d_d$ from a first MP (504a). The distance of FSP 502a to MP 504a is $d_{fm1}$. The distance of FSP 502b to MP 504b is $d_{fm2}$. The distance of FSP 502c to MP 504c is $d_{fm3}$. In one example of system 500, $d_{fm3}$ is larger than $d_{fm2}$, which is larger than $d_{fm1}$. In another example, $d_{fm3}$ is equal to $d_{fm2}$, which is equal to $d_{fm1}$.

In one example of system 500, the overall system length may be shorter than system 400 according to:

$$v_m t_T = (d_d + w) = d{fm1},$$

where:

$d_d$ is the distance between the stacked FSPs (502a, 502b, 502c) and MP 504a.

In particular, by stacking each FSP on top of each other, the total distance of the system is reduced compared to that of system 400, thus making it more compact.

In an example, system 500 is configured according to the above described overall length $d_s$ and/or maximum velocity $v_m$ of the object.

In another example, system 500 includes one or more proximity sensors for each FSP and for each MP for determining the presence of an object within a field of view of a respective probe.

The example of system 500 shown in FIG. 5 may be configured to a respective frequency range to detect three different materials (i.e. one unique material per matched probe pair, such as FSP 502a and MP 504a). However, more or fewer probe pairs may be utilized to design the system for a different number of materials. For example, if five materials were to be identified, then there would be five matched probe pairs.

In other examples, one or more probe pairs may be used to scan the same material for added reliability. For example, a reliability value may be calculated for each probe pair scanning the same material, and the respective reliability values may be combined in a weighted average or other combination to increase an overall reliability of the measurement.

Figure 6:
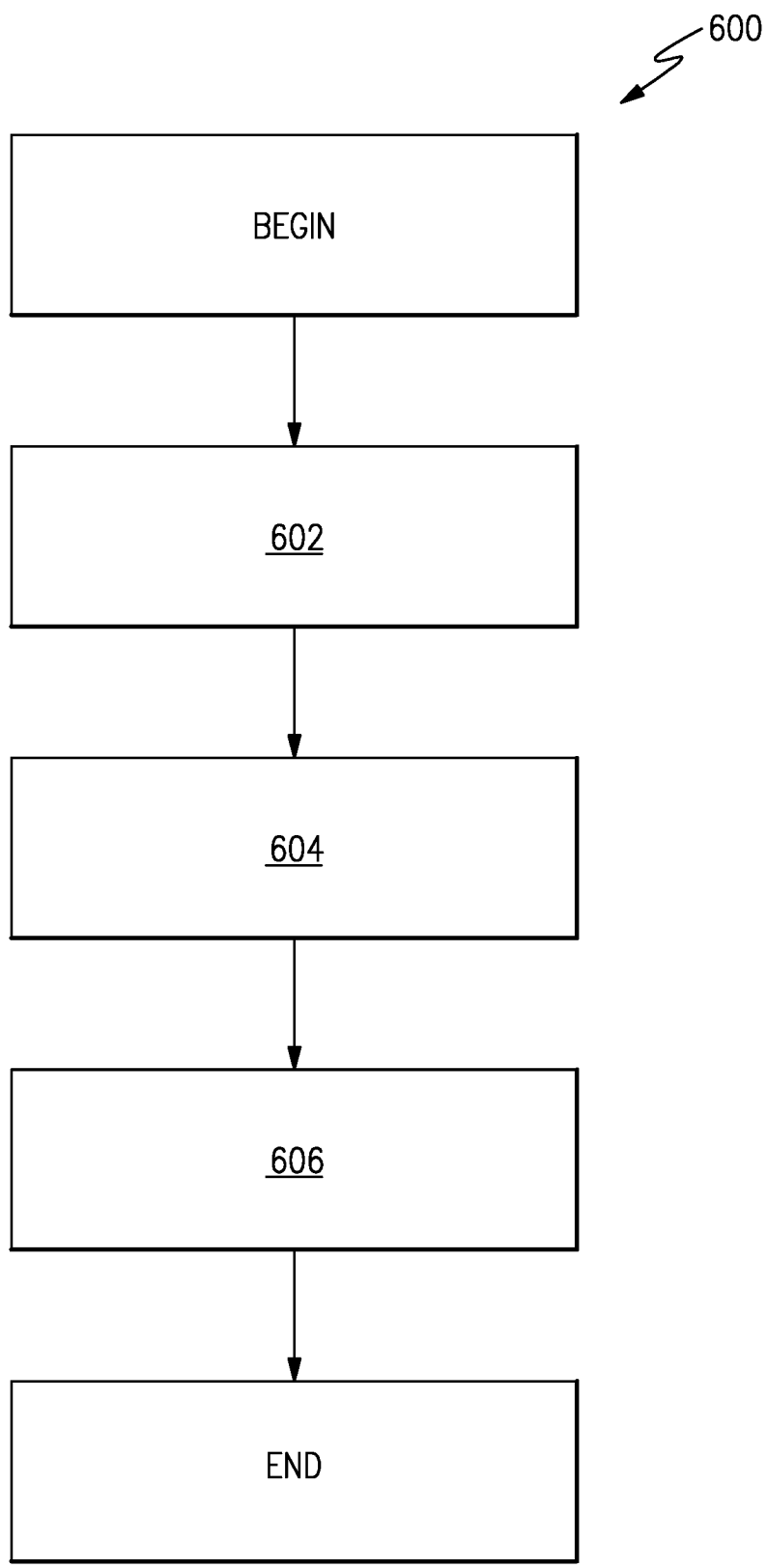
FIG. 6 is a logic flowchart of an example method of NQR measurement of an object.

FIG. 6 is a logic flowchart of an example method 600 of NQR measurement of an object. The method 600 utilizes any NQR system disclosed herein. Method 600 also works with other suitable systems not disclosed herein.

In one example, method 600 is utilized with any of system 100, system 200, system 300, system 400, and system 500. Accordingly, method 600 is applicable to an NQR system having at least one FSP, at least one MP, at least one matching network, at least one auto-tuner controller and at least one master controller.

Step 602 includes detecting the presence of a moving object as it enters a field of view of a forward sensing resonance probe (102, 202, 302, 402a, 402b, 402c, 502a, 502b, or 502c). The object is detected either by a proximity sensor and/or can be detected by one of the FSPs.

Step 604 includes determining an amount of resonance detuning of the one or more FSPs caused by the detected object. The amount of detuning is determined as the difference in impedance of the one or more FSPs between the point in time before the object has entered a field of view of the one or more FSPs and when the object is fully within the field of view.

In one example, the amount of detuning is a maximum amount of detuning relative the amount of impedance of the one or more FSPs before the object enters the field of view. A master controller instructs an auto-tuner controller to determine the amount of tuning needed to optimize the matching network.

Step 606 includes pre-tuning a main NQR probe (104, 204, 304, 404a, 404b, 404c, 504a, 504b, or 504c) based on the amount of detuning of the one or more FSPs.

According to aspects and embodiments, the method 600 can have optional additional steps. In one example, the object is determined to be departing a field of view of one or more FSPs with a proximity sensor.

In one example, the object is determined to be entering or within a field of view of one or more MPs using at least one proximity sensor.

In one example, the object is determined to be within a field of view of the one or more MPs based on a measured velocity.

In one example, the object is determined to be within a field of view of the one or more MPs based on a measured velocity and time since the object left the field of view of the one or more FSPs.

In one example, the object is determined to be within a field of view of the one or more MPs after a predetermined amount of time has passed.

In another example, the object is determined to be within a field of view of the one or more MPs when a predetermined amount of time has passed since the object left the field of view of the one or more FSPs.

In one example, the object is determined to be within a field of view of the one or more MPs after a predetermined amount of time has passed.

In a case of a system having multiple MPs, an example of method 600 utilizes a system configured according to the above described overall length $d_s$ and/or maximum velocity $v_m$ of the object. It is also contemplated in the case of multiple MPs that each MP can detect a different material or multiple MPs can detect the same material to calculate a level of confidence for the same material.

Figure 7:
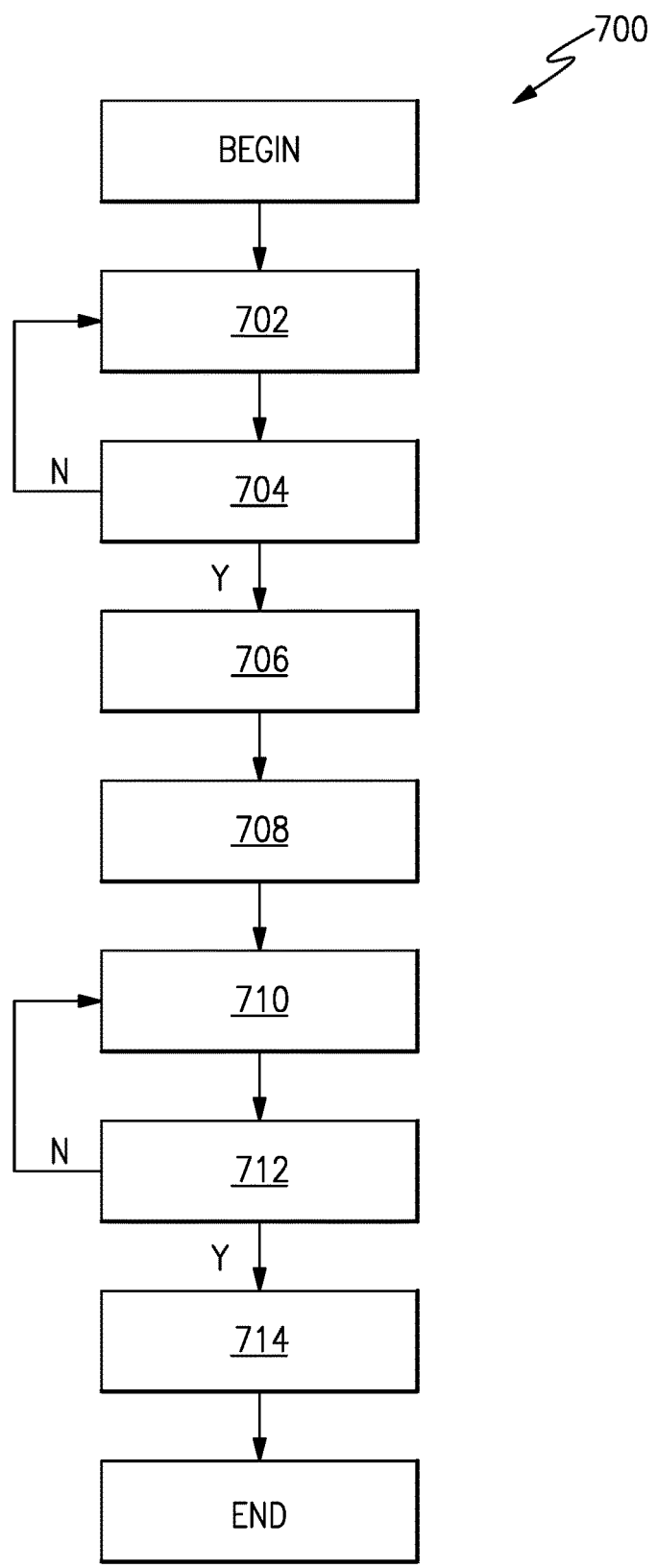
FIG. 7 is a logic flowchart of an example method of NQR measurement of an object.

FIG. 7 is a logic flowchart of an example method 700 of resonance measurement of an object. Method 700 utilizes any NQR system disclosed herein. Method 700 can also work with other systems not disclosed herein.

Step 702 includes performing a first determination of whether a moving object is detected within a field of view of at least one forward sensing resonance probe (102, 202, 302, 402a, 402b, 402c, 502a, 502b, or 502c). If no object is detected within the field of view (702N), the method repeats the determination of step 702. When an object is detected to be within the field of view, the method proceeds to step 704.

In the case of multiple FPs (402a, 402b, 402c) arranged in a parallel-like configuration, the determination in step 702 is simultaneously made for any one of the FSPs or a combination of more than one FSP.

In the case of multiple FPs (402a, 402b, 402c) arranged in a series, the determination in step 702 is made for in series in time for each FSP, with the FSP closest to where the object would first enter a field of view of the system being the first.

In the case of multiple FPs stacked on top of each other (502a, 502b, 502c), the determination in step 702 is made simultaneously for any one of the FSPs or a combination of more than one FSP.

Step 704 includes triggering a measurement of the moving object once it is determined to be within the field of view of the FSP(s) in step 702.

In the case of multiple FPs (402a, 402b, 402c) arranged in a parallel-like configuration, the triggering in step 704 is done for any one of the FSPs or a combination of more than one FSP at approximately the same time.

In the case of multiple FPs (402a, 402b, 402c) arranged in a series, the triggering in step 702 is made first for the FSP closest to where the object would first enter a field of view of the system, and then for the next FSP the object would pass, and so on.

In the case of multiple FPs stacked on top of each other (502a, 502b, 502c), the triggering in step 702 is made simultaneously for any one of the FSPs or a combination of more than one FSP.

Step 706 includes determining an amount of detuning of the FSP(s) caused by the detected moving object. In the case of multiple FSPs, the amount of detuning in each FSP can be determined in any order as long as the object has first entered a field of view of the respective FSP.

In the case of multiple FPs (402a, 402b, 402c) arranged in a parallel-like configuration, the measuring in step 706 is simultaneously made for any one of the FSPs or a combination of more than one FSP.

In the case of multiple FPs (402a, 402b, 402c) arranged in a series, the measurement in step 706 is made for in series in time for each FSP, with the FSP closest to where the object would first enter a field of view of the system being the first.

In the case of multiple FPs stacked on top of each other (502a, 502b, 502c), the measurement in step 706 is made simultaneously for any one of the FSPs or a combination of more than one FSP.

Step 708 includes calculating a speed of the object measured by the FSP. By determining the speed of the object, the system can determine how long to wait until a first or each respective MP is activated to measure the object. Alternatively, step 708 could be modified to instead use a predetermined amount of time from when the object enters or leaves a particular field of view of an FSP to trigger measurement by a respective MP. However, it is appreciated that determining the speed and knowing the dimensions of the system would be a more efficient use of available power and measurement time.

Step 710 includes pre-tuning a main NQR probe (MP) based on the amount of detuning of the FSP.

In the case of multiple MPs arranged in a parallel-like configuration, the pre-tuning in step 710 is simultaneously done for the MPs or a combination of more than one MP.

In the case of multiple MPs arranged in a series, the pre-tuning in step 710 is done for each MP in series in coordination with the measurement from each FSP, with the MP closest to where the object would first enter a field of view of the MP being the first.

In a case of multiple pairs of FSPs and MPs, each MP is pre-tuned to the amount of detuning in its respective FSP.

In one example, the MPs are pre-tuned after the last FSP determines an amount of detuning.

In another example, the MPs are each pre-tuned when their respective FSP is used to determine a respective amount of detuning.

Any order of pre-tuning the MPs is possible, as long as a particular MP's matching FSP has measured the object first.

Step 712 includes performing a second determination of whether the moving object is detected within a field of view of the MP(s). In the case of multiple FSPs and MPs and one MP being closer to the FSPs than the other MPs, the second determination is made for the closer MP.

In the case of the MPs being at substantially the same distance to the FSPs, the second determination can be made for any combination of one or more MPs.

If the moving object is not detected by any MP, then step 712 is repeated until the moving object is successfully detected. In one example, the object is determined to be within a field of view of one or more MPs using at least one proximity sensor. In another example, the object is determined to be within a field of view of the one or more MPs when a predetermined amount of time has passed since the object left the field of view of the one or more FSPs. In another example, the object is determined to be within a field of view of the one or more MPs after a predetermined amount of time has passed. Upon successful detection, the method proceeds to step 714.

It is appreciated that step 712 can be done before step 710 and vice versa.

Step 714 includes performing an NQR measurement on the moving object with the MP(s).

In the case of multiple MPs arranged in a parallel-like configuration, the measuring step 714 is simultaneously done for the MPs or a combination of more than one MP.

In the case of multiple MPs arranged in a series, the measuring step 714 is done for each MP in series in coordination with the measurement from each FSP, with the MP closest to where the object would first enter a field of view of the MP being the first.

According to aspects and embodiments, the method 700 can have optional additional steps. In one example, the object is determined to be departing a field of view of one or more FSPs with a proximity sensor.

In one example, the object is determined to be entering or within a field of view of one or more MPs using at least one proximity sensor.

In one example, the object is determined to be within a field of view of the one or more MPs based on a measured velocity.

In one example, the object is determined to be within a field of view of the one or more MPs based on a measured velocity and time since the object left the field of view of the one or more FSPs.

In one example, the object is determined to be within a field of view of the one or more MPs after a predetermined amount of time has passed.

In one example, the object is determined to be within a field of view of the one or more MPs after a predetermined amount of time has passed since the object left the field of view of the one or more FSPs.

In one example, measuring the moving object includes identifying a particular material of the moving object.

In the case of using multiple MPs, method 700 utilizes a system configured according to the above described overall length $d_s$ and/or maximum velocity $v_m$ of the object. It is also contemplated in the case of multiple MPs that each MP detects a different material or multiple MPs detects the same material to calculate a level of confidence for the same material.

Figure 8:
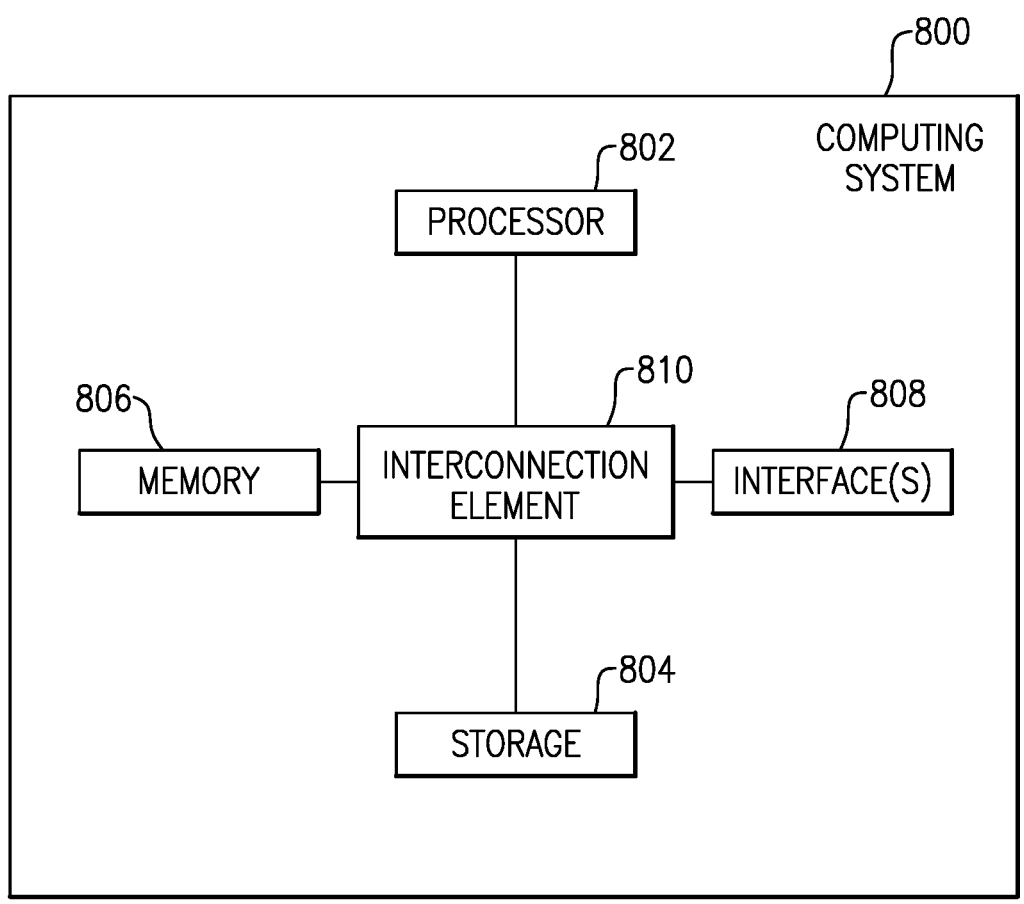
FIG. 8 is an example computing system for controlling any of the NQR systems described herein or for implementing any of the NQR measurement methods described herein.

FIG. 8 illustrates one example of a computing system 800 that implements software routines corresponding to various components of a tuner, such as tuner 116 of FIG. 1 and/or other components of an auto-tuner controller or master controller, such as those in FIG. 2A, FIG. 3, FIG. 4 and FIG. 5. The computing system 800 may additionally control one or more of each FSP and MP to perform a measurement and receive data about the object.

In an example, the computing system 800 includes at least one processor 802, at least one data store 804, at least one memory 806, and one or more interfaces 808, such as a system interface and/or a user interface. While not explicitly illustrated in FIG. 8, in certain examples the computing system 800 is coupled to a power source.

In an example, the power source delivers power to one or more components of the computing system 800, as well as other components of the systems of FIG. 1, FIG. 2A, FIG. 3, FIG. 4 and FIG. 5.

In FIG. 8, the processor 802 is coupled to the data storage 804, memory 806, and the various interfaces 808. The memory 806 stores programs (e.g., sequences of instructions coded to be executable by the processor 802) and data during operation of the computing system 800.

In an example, the memory 806 is a relatively high performance, volatile, random access memory such as a dynamic random access memory ("DRAM") or static memory ("SRAM").

In another example, the memory 806 includes any device for storing data, such as a disk drive or other nonvolatile storage device. Various examples organize the memory 806 into particularized and, in some cases, unique structures to perform the functions disclosed herein. These data structures are sized and organized to store values for particular data and types of data.

The data storage 804 includes a computer readable and writeable data storage medium configured to store non-transitory instructions and other data, and include nonvolatile storage media, such as optical or magnetic disk, ROM or flash memory.

In an example, the instructions include executable programs or other code that is executed by the at least one processor 802 to perform any of the functions described herein.

In various examples, the computing system 800 includes one or more interface(s) 808, such as a system interface and/or a user interface. Such a user interface includes a graphical user interface (GUI) or a non-graphical interface such as a panel including control buttons and/or switches. Each of the interface(s) 808 is configured to exchange, e.g., send or receive, data with other components of the computing system 800, or other devices in communication with the computing system 800. According to various examples, the interface components 808 include hardware components, software components, or a combination of hardware and software components.

In certain examples, components of the interface(s) 808 couple the processor 802 to one or more other components of the systems shown in FIG. 2A. FIG. 3, FIG. 4 and FIG. 5. The processor 802 then provides one or more control signals to any such components and manage the operation of such components, as described above.

In an example, processor 802 is configured to control one or more proximity sensors, one or more FSPs, one or more MPs, one or more matching networks, one or more auto-tuner controllers and/or one or more master controllers in any of the systems described in FIG. 1. FIG. 2A, FIG. 3. FIG. 4 and FIG. 5.

In one example, any auto-tuner controller or master controller disclosed herein may be implemented by processor 802.

In another example, processor 802 executes a computer program stored in storage 804 and/or memory 806, the program corresponding to method 600 or method 700.

In an example, any step or combination of steps in method 600 or method 700 is automated by a processor or includes manual input from a user.

In another example, a user interface includes hardware and/or software components that allow a corresponding transmitter or receiver in which the computing system 800 is incorporated to communicate with an external entity, such as a user. These components are configured to receive information from user interactions with the user interface. Examples of the components that are employed within the user interface include buttons, switches, light-emitting diodes, touch screens, displays, stored audio signals, voice recognition, or an application on a computer-enabled device in communication with the computing system 800. Data received at the various interfaces is provided to the processor 802, as illustrated in FIG. 8. Communication coupling (e.g., shown interconnection element 810) between the processor 802, memory 806, data storage 804, and interface(s) 808 is implemented as one or more physical busses in conformance with standard, proprietary, or specialized computing bus technologies.

The processor 802 performs a series of instructions that result in manipulated data that is stored in and retrieved from the data storage 804, as discussed above. In various examples, the series of instructions result in the detection of a moving object, measurement by one or more FSPS, a determination of an amount of detuning and measurement by one or more MPs as discussed above.

The processor 802 is any type of processor, multiprocessor or controller, whether commercially available or specially manufactured.

In an example, the processor includes a commercially available processor, such as a processor manufactured by INTEL. AMD. MOTOROLA, or FREESCALE. In some examples, the processor is implemented on a field-programmable array (FPGA) or other programmable electronic device. In some examples, the processor 802 is configured to execute a program implemented on an operating system. Examples of a particular operating system that is executed include a Windows-based operating system, such as, Windows NT, Windows 2000 (Windows ME). Windows XP. Windows Vista. Windows 7, or Windows 10 operating systems, available from the Microsoft Corporation, a MAC OS System X operating system available from Apple Computer, one of many Linux-based operating system distributions, for example, the Enterprise Linux operating system available from Red Hat Inc., a Solaris operating system available from Sun Microsystems. or a UNIX operating systems available from various sources. Many other operating systems are usable, and examples are not limited to any particular operating system. Example operating systems include those implemented in any computer programming language usable with such operating systems above, such as JAVASCRIPT, PYTHON, JAVA, C++ or C#.

In an example, the operating system provides platform services to application software. These platform services include inter-process and network communication, file system management and standard database manipulation.

Additionally, as an example, various aspects and functions are implemented in a non-programmed environment, for example, documents created in HTML, XML or other format that, when viewed in a window of a browser program, render aspects of a graphical-user interface or perform other functions. Further, various examples are implemented as programmed or non-programmed elements, or any combination thereof. For example, a web page is implemented using HTML while a data object called from within the web page is written in C++. Thus, the examples are not limited to a specific programming language and any suitable programming language could be used. Accordingly, the functional components disclosed herein exemplarily include a wide variety of elements, e.g. specialized hardware, executable code, data structures or objects, that are configured to perform the functions described herein.

In an example, computing system 800 communicates with and control any of the systems described above from a remote location. The remote location is located on a Local Area Network (LAN), on a server accessed over the Internet, or in a cloud environment.

Having described above several aspects of at least one embodiment, it is to be appreciated various alterations, modifications, and improvements will readily occur to those skilled in the art. Such alterations, modifications, and improvements are intended to be part of this disclosure and are intended to be within the scope of the invention.

It is to be appreciated that embodiments of the methods and apparatuses discussed herein are not limited in application to the details of construction and the arrangement of components set forth in the following description or illustrated in the accompanying drawings. The methods and apparatuses are capable of implementation in other embodiments and of being practiced or of being carried out in various ways. Examples of specific implementations are provided herein for illustrative purposes only and are not intended to be limiting. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items. References to "or" is construed as inclusive so that any terms described using "or" indicate any of a single, more than one, and all of the described terms. Any references to front and back, left and right, top and bottom, upper and lower, and vertical and horizontal are intended for convenience of description, not to limit the present systems and methods or their components to any one positional or spatial orientation.

Accordingly, the foregoing description and drawings are by way of example only, and the scope of the invention should be determined from proper construction of the appended claims, and their equivalents.

What is claimed is:

1. A method of nuclear quadrupole resonance (NQR) measurement of an object, comprising:
   detecting an object as it enters a field of view of a forward sensing resonance probe (FSP);
   determining an amount of resonance detuning of the FSP caused by the detected object; and
   pre-tuning a main NQR probe (MP) based on the amount of detuning of the FSP.

2. The method of claim 1, wherein the pre-tuning occurs before the object enters a field of view of the MP and after the amount of resonance detuning of the FSP is determined.

3. The method of claim 1, wherein detecting the object with the FSP includes detecting the object entering the field of view of the FSP with the at least one proximity sensor.

4. The method of claim 3, further comprising, in response to detecting the object, asynchronously triggering a resonance measurement of the object with the FSP to determine the amount of resonance detuning of the FSP.

5. The method of claim 4, wherein the resonance measurement comprises measuring an impedance including a reactance of the object.

6. The method of claim 5, wherein the pre-tuning of the MP is based on the measured impedance.

7. The method of claim 1, wherein the pre-tuning of the MP comprises tuning the MP to an opposite reactance of a measured reactance of the FSP.

8. The method of claim 1, wherein the FSP also determines a speed of the object.

9. The method of claim 1, further comprising:
   performing a first determination of whether the object is detected within the field of view of the (FSP); and
   when the object is detected within the field of view of the FSP, triggering a measurement of the object.

10. The method of claim 9, further comprising:
    performing a second determination of whether the object is detected within a field of view of the MP; and
    when the object is detected within the field of view of the MP, measuring the object with the MP.

11. A nuclear quadrupole resonance (NQR) measuring system, comprising:
    a forward sensing resonance probe (FSP);
    a main NQR probe (MP); and
    a tuner coupled to each of the forward sensing resonance probe and the main NQR probe;
    wherein the FSP is configured to detect an object as it enters a field of view of the FSP and to measure the object and determine an amount of resonance detuning of the FSP caused by the detected object; and wherein the tuner is configured to pre-tune the MP based on the determined amount of resonance detuning of the FSP.

12. The system of claim 11, wherein the FSP includes at least one proximity sensor and detecting the object with the FSP includes detecting the object entering the field of view with the at least one proximity sensor.

13. The system of claim 12, wherein in response to detecting the object with the at least one proximity sensor, the FSP asynchronously triggers a resonance measurement of the object to determine the amount of resonance detuning of the FSP.

14. The system of claim 13, wherein the resonance measurement comprises determining an impedance including a reactance of the object.

15. The system of claim 14, wherein the pre-tuning of the MP is based on the determined impedance.

16. The system of claim 11, wherein the pre-tuning of the MP comprises tuning the MP to an opposite reactance of a measured reactance of the FSP.

17. The system of claim 11, wherein the FSP is also configured to determine a speed of the object.

18. The system of claim 11, wherein the system includes a plurality of FSPs and a plurality of MPs, and
   each FSP of the plurality of FSPs having a corresponding MP of the plurality of MPs.

19. The system of claim 18, wherein each FSP of the plurality of FSPs and each MP of the plurality of MPs has a respective matching network.

20. The system of claim 18, wherein all FSPs of the plurality of FSPs are stacked on top of each other.

21. The system of claim 11, wherein the system includes a plurality of MPs, wherein the plurality of MPs is arranged in a series, and each MP is tuned to a different frequency.

* * * * *